United States Patent
Kwon et al.

(10) Patent No.: US 11,917,884 B2
(45) Date of Patent: Feb. 27, 2024

(54) DISPLAY APPARATUS INCLUDING LIGHT CONTROL MEMBER AND MANUFACTURING METHOD OF LIGHT CONTROL MEMBER

(71) Applicant: Samsung Display Co., LTD., Yongin-si (KR)

(72) Inventors: Youngsoo Kwon, Hwaseong-si (KR); Soodong Kim, Hwaseong-si (KR); Jinwon Kim, Hwaseong-si (KR); Hye-Jin Paek, Hwaseong-si (KR); Taeyoung Song, Changwon-si (KR); Kiheon Lee, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 308 days.

(21) Appl. No.: 17/242,730

(22) Filed: Apr. 28, 2021

(65) Prior Publication Data
US 2021/0408135 A1 Dec. 30, 2021

(30) Foreign Application Priority Data

Jun. 24, 2020 (KR) .................. 10-2020-0077274

(51) Int. Cl.
*H10K 59/38* (2023.01)
*H10K 50/844* (2023.01)
(Continued)

(52) U.S. Cl.
CPC ........... *H10K 59/38* (2023.02); *H10K 50/844* (2023.02); *H10K 50/854* (2023.02);
(Continued)

(58) Field of Classification Search
None
See application file for complete search history.

(56) References Cited

U.S. PATENT DOCUMENTS

2019/0204497 A1  7/2019  Jeon et al.
2020/0081292 A1  3/2020  Park et al.
(Continued)

FOREIGN PATENT DOCUMENTS

CN  111286232  6/2020
EP  3 447 572  2/2019
(Continued)

OTHER PUBLICATIONS

Extended European search report for European Patent Application or Patent No. 21180601.3 dated Nov. 19, 2021.

*Primary Examiner* — Michael Lebentritt
(74) *Attorney, Agent, or Firm* — KILE PARK REED & HOUTTEMAN PLLC

(57) ABSTRACT

A display apparatus includes a display panel; and a light control member disposed on the display panel. The light control member includes a plurality of partition walls spaced apart from each other, and a plurality of light control units each disposed between any two of the plurality of partition walls, and at least one of the plurality of light control units includes a first region containing organic monomers and an inorganic material and a second region containing the inorganic material dispersed in an organic polymer, thereby improving display quality and reliability of the display apparatus.

20 Claims, 16 Drawing Sheets

(51) Int. Cl.
*H10K 50/854* (2023.01)
*H10K 50/86* (2023.01)
*H10K 59/12* (2023.01)
*H10K 71/00* (2023.01)

(52) U.S. Cl.
CPC ........... *H10K 50/865* (2023.02); *H10K 59/12* (2023.02); *H10K 71/00* (2023.02)

(56) References Cited

U.S. PATENT DOCUMENTS

2020/0119237 A1    4/2020  Kim et al.
2022/0320467 A1*  10/2022  Ye .......................... H10K 59/38

FOREIGN PATENT DOCUMENTS

| | | | |
|---|---|---|---|
| JP | 2005149942 A | * | 6/2005 |
| JP | 2019-113765 | | 7/2019 |
| KR | 10-2018-0015784 | | 2/2018 |
| KR | 10-2019-0082351 | | 7/2019 |
| KR | 10-2020-0030147 | | 3/2020 |

* cited by examiner

DISPLAY APPARATUS INCLUDING LIGHT CONTROL MEMBER AND MANUFACTURING METHOD OF LIGHT CONTROL MEMBER

CROSS-REFERENCE TO RELATED APPLICATION(S)

This U.S. non-provisional patent application claims priority to and the benefit of Korean Patent Application No. 10-2020-0077274 under 35 U.S.C. § 119, filed in the Korean Intellectual Property Office (KIPO) on Jun. 24, 2020, the entire contents of which are incorporated herein by reference.

BACKGROUND

The disclosure herein relates to a display apparatus including a light control member and a manufacturing method of the light control member, and more specifically, to a display apparatus including a light control member having improved luminous efficiency and reliability and a manufacturing method of the light control member.

Display panels include a transmissive display panel that selectively transmits source light generated from a light source and a light emitting display panel that generates source light in the display panel itself. The display panels may include different types of color control layers according to pixels to generate color images. The color control layers may transmit only a partial wavelength range of the source light or convert the color of the source light. Some color control layers may change the properties of light without converting the color of the source light.

SUMMARY

The disclosure provides a display apparatus having improved display quality and reliability by including a light control member having improved light conversion efficiency.

The disclosure also provides a method for manufacturing a light control member having improved light conversion efficiency as well as having reduced processes and costs.

An embodiment of the disclosure provides a display apparatus including a display panel; and a light control member disposed on the display panel. The light control member may include a plurality of partition walls spaced apart from each other, and a plurality of light control units each disposed between any two of the plurality of partition walls. At least one of the plurality of light control units may include a first region including organic monomers and an inorganic material, and a second region including the inorganic material dispersed in an organic polymer.

In an embodiment, the inorganic material may include scattering particles and light emitters.

In an embodiment, a concentration of the inorganic material in the first region may be greater than a concentration of the inorganic material in the second region.

In an embodiment, a ratio of a concentration of the inorganic material in the second region to a concentration of the inorganic material in the first region may be in a range of about 1:1.5 to about 1:20.

In an embodiment, a ratio of a thickness of the first region to a thickness of the second region may be in a range of about 1:1 to about 1:200.

In an embodiment, the thickness of the first region may be in a range of about 0.1 μm to about 5 μm, and the thickness of the second region may be in a range of about 5 μm to about 20 μm.

In an embodiment, with respect to a total volume of the first region, a volume of the organic monomers of the first region may be in a range of about 0.01% to about 10%, and a volume of the light emitters of the first region may be in a range of about 10% to about 99.9%.

In an embodiment, with respect to a total volume of the second region, a volume of the organic polymer of the second region may be in a range of about 10% to about 90%, and a volume of the light emitters of the second region may be in a range of about 5% to about 50%.

In an embodiment, the organic polymer of the second region may be identical to a photocurable polymer of the organic monomers of the first region.

In an embodiment, the display panel may include a light emitting element generating first light, the light control member may include a transmission unit transmitting the first light; a first light control unit converting the first light into second light; and a second light control unit converting the first light into third light, and the first light control unit and the second light control unit may include the first region and the second region.

In an embodiment, the inorganic material of the first light control unit may include a first light emitter converting the first light into the second light, and the inorganic material of the second light control unit may include a second light emitter converting the first light into the third light.

In an embodiment, the transmission unit may include scatterers dispersed in the organic polymer.

In an embodiment of the disclosure, a display apparatus may include a display panel generating first light, and a light control layer disposed on the display panel. The light control layer may include a transmission unit transmitting the first light, a first light control unit converting the first light into second light, and a second light control unit converting the first light into third light, and at least one of the first light control unit or the second light control unit includes a first region including organic monomers and an inorganic material, and a second region including the inorganic material dispersed in an organic polymer.

In an embodiment, the display panel may include a light emitting element generating the first light, an encapsulation member disposed on the light emitting element, and a capping layer disposed on the encapsulation member and the light control layer.

In an embodiment, the display apparatus may further include a color filter layer disposed on the light control unit, the color filter layer including a first color filter unit overlapping the transmission unit and transmitting first light, a second color filter unit overlapping the first light control unit, blocking the first light, and transmitting second color light, and a third color filter unit overlapping the second light control unit, blocking the first light, and transmitting third light.

In an embodiment of the disclosure, a manufacturing method of a light control member may include forming a color filter layer, and forming a light control layer including a plurality of light control units on the color filter layer. The forming of the light control layer may include providing a first ink on the color filter layer to form a first ink layer; providing heat to the first ink layer to form a first region; providing the first ink on the first region to form a second ink layer; and curing the second ink layer to form a second region. The first ink may include organic monomers, light emitters, and a photoinitiator.

In an embodiment, the providing of the heat to the first ink layer to form the first region may include providing the heat in a range of about 150° C. to about 200° C. onto the first ink layer to form the first region having a smaller thickness than a thickness of the first ink layer.

In an embodiment, the forming of the color filter layer may include forming a first color filter, a second color filter, and a third color filter to be disposed adjacent to each other on a plane.

In an embodiment, the manufacturing method may further include, before the providing of the first ink on the color filter layer to form the first ink layer, disposing a plurality of partition walls so that openings are generated in regions overlapping the first color filter, the second color filter, and the third color filter. The first ink may be provided to at least one of openings overlapping the second color filter and the third color filter.

In an embodiment, the providing of the first ink to form the first ink layer and the providing of heat to the first ink layer to form the first region may be repeatedly performed at least two times.

BRIEF DESCRIPTION OF THE DRAWINGS

The accompanying drawings are included to provide a further understanding of the disclosure and are incorporated in and constitute a part of this specification. The drawings illustrate embodiments of the disclosure and, together with the description, serve to explain principles of the disclosure. In the drawings.

DETAILED DESCRIPTION OF THE EMBODIMENTS

Figure 1:
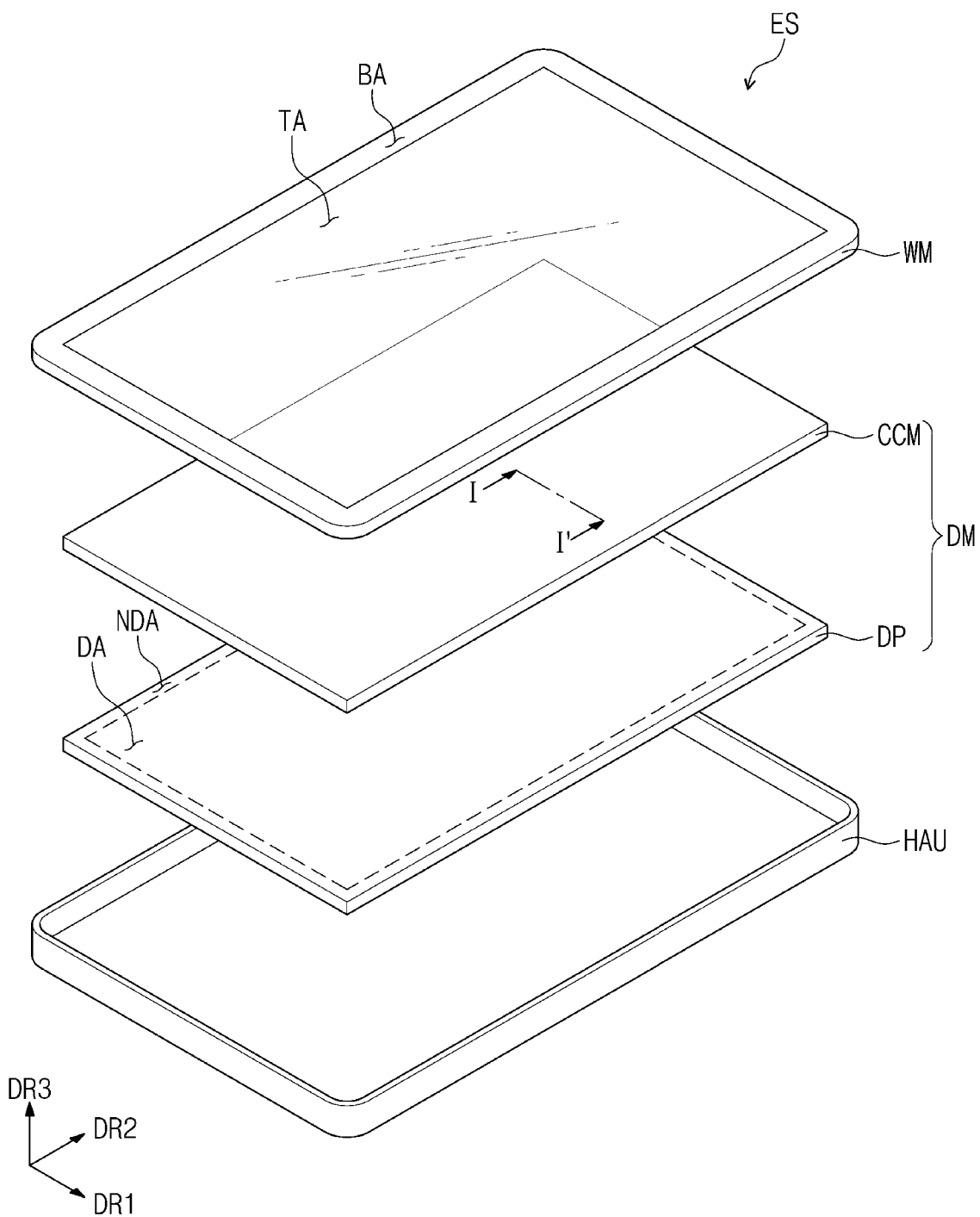
FIG. 1 is a schematic exploded perspective view of a display apparatus according to an embodiment of the disclosure.

Hereinafter, embodiments of the disclosure will be described with reference to the accompanying drawings.

In the description, when an element (or a region, a layer, a portion, etc.) is referred to as being "on," "connected to," or "coupled to" another element, it means that the element may be directly connected to/coupled to the another element, or that a third element may be disposed therebetween.

Like reference numerals refer to like elements throughout. Also, in the drawings, the thickness, the ratio, and the dimensions of elements may be exaggerated for an effective description of technical contents. The term "and/or" includes all combinations of one or more of which associated configurations may define. For example, "A and/or B" may be understood to mean "A, B, or A and B."

It will be understood that, although the terms "first," "second," or the like may be used herein to describe various elements, these elements should not be limited by these terms. These terms are only used to distinguish one element from another. For example, a first element could be termed a second element, and, similarly, a second element could be termed a first element, without departing from the scope of example embodiments of the disclosure. The terms of a singular form may include plural forms unless the context clearly indicates otherwise.

Terms such as "below," "lower," "above," "upper," and the like are used to describe the relationship of the configurations shown in the drawings. The terms are used as a relative concept and are described with reference to the direction indicated in the drawings.

It should be understood that the terms "comprise," "include" or "have" are intended to specify the presence of stated features, integers, steps, operations, elements, components, or combinations thereof in the disclosure, but do not preclude the presence or addition of one or more other features, integers, steps, operations, elements, components, or combinations thereof.

Being "directly disposed on" herein means that there are no intervening layers, films, regions, plates, or the like between a part such as a layer, a film, an area, and a plate and another part. For example, being "directly disposed on" may mean being disposed on a layer without using an additional member, such as an adhesive member.

In the specification and the claims, the phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by one of ordinary skill in the art to which the disclosure pertains. It is also to be understood that terms, such as those defined in commonly used dictionaries, should be interpreted as having meanings that is consistent with the meanings in the context of the related art and the disclosure, and should not be interpreted in an ideal or excessively formal sense unless clearly defined herein.

Hereinafter, a light control member and a display apparatus including the same according to an embodiment will be described with reference to the drawings.

Figure 2:
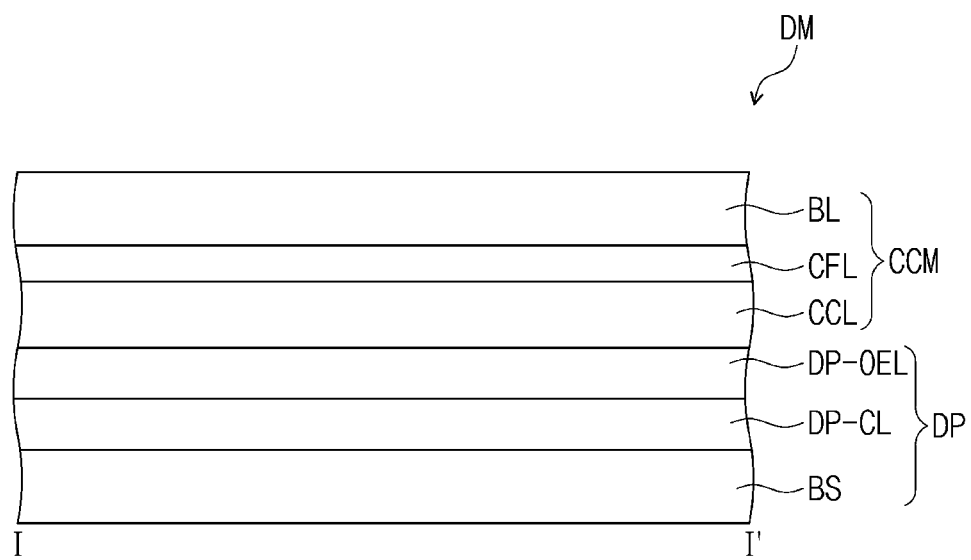
FIG. 2 is a schematic cross-sectional view of a display module according to an embodiment of the disclosure.
Figure 2:
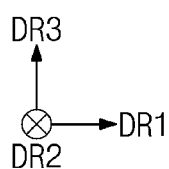

FIG. 1 is a schematic exploded perspective view of a display apparatus according to an embodiment. FIG. 2 is a schematic cross-sectional view of a display module according to an embodiment. FIG. 2 is a cross-sectional view taken along line I-I' of FIG. 1.

In an embodiment, a display apparatus ES may be a large-scale electronic device, such as a television, a monitor, or an outdoor advertising board. Also, the display apparatus ES may be used for small or medium-sized products such as personal computers (PCs), laptop computers, personal digital assistants, car navigation systems, game consoles, smartphones, tablet PCs, and cameras. These devices are merely provided as examples, and other display apparatuses may be employed as long as not departing from the disclosure.

The display apparatus ES of an embodiment may include a window WM, a display module DM, and a housing HAU. The display module DM may include a display panel DP, which is a display element. Although not illustrated in the figures, the display apparatus ES may include various elements activated in response to an electrical signal, such as touch elements or detection elements, in addition to the display element.

For the sake of convenience, a third direction DR3 may be defined as a direction in which an image is provided to a user. A first direction DR1 and a second direction DR2 may be orthogonal to each other, and the third direction DR3 may be a normal direction with respect to a plane defined by the first direction DR1 and the second direction DR2. The plane defined by the first direction DR1 and the second direction DR2 in FIG. 1 may be a display surface in which an image is provided. The thickness direction of the display apparatus ES may be indicated as the third direction DR3. A front surface (or top surface) and a rear surface (or bottom surface) of each of the members may be distinguished in the third direction DR3. However, directions that are indicated as the first to third directions DR1 to DR3 may have a relative concept and may be changed to other directions. Hereinafter, first to third directions may refer to the same reference symbols as directions indicated as the first and third directions DR1 to DR3, respectively.

In the display apparatus ES of an embodiment, the window WM may be disposed on the display module DM. The window WM may be formed of a material including glass, sapphire, or plastic. The window WM may include a transmission region TA configured to transmit the image provided from the display module DM and a light-blocking region BA which is adjacent to the transmission region TA and in which the image is not transmitted. Unlike the display apparatus ES illustrated in FIG. 1, in an embodiment, the window WM may be omitted from the display apparatus ES.

In the display apparatus ES of an embodiment, the display module DM may be disposed below the window WM. The display module DM may include a display panel DP and a light control member CCM disposed on the display panel DP.

The display panel DP may be a luminous display panel. For example, the display panel DP may be a light-emitting diode (LED) display panel, an organic electroluminescence display panel, or a quantum dot light emitting display panel. However, the embodiments are not limited thereto.

The LED display panel may include a light emitting diode, an emission layer of the organic electroluminescence display panel may include an organic electroluminescent material, and an emission layer of the quantum dot light emitting display panel may include a quantum dot, a quantum rod, or the like. Hereinafter, the display panel DP included in the display apparatus ES of an embodiment will be described as the organic electroluminescence display panel. However, the embodiments are not limited thereto.

The display apparatus ES of an embodiment may include the display panel DP and the light control member CCM disposed on an upper portion of the display panel DP, and the display apparatus ES of an embodiment may be an organic electroluminescence display apparatus including the organic electroluminescence display panel. The display panel DP may provide first light. For example, the display panel DP may emit blue light.

The light control member CCM may convert the wavelength of the light provided from the display panel DP or may transmit the light provided from the display panel DP. The light control member CCM may convert the wavelength of the blue light provided from the display panel DP or may transmit the blue light.

On a plane or in a plan view, a surface of the display panel DP on which an image is displayed may be defined as a display surface. The display surface may include a display region DA in which an image is displayed and a non-display region NDA in which an image is not displayed. The display region DA may be defined at the center of the display panel DP in a plan view and thus may overlap the transmission region TA of the window WM.

The housing HAU may be disposed below the display panel DP to accommodate the display panel DP. The housing HAU may cover or overlap the display panel DP so that the upper surface, the display surface, of the display panel DP is exposed. The housing HAU may cover the side surface and the bottom surface of the display panel DP and may expose the entire upper surface thereof.

Referring to FIG. 2, the display panel DP may include a base substrate BS, a circuit layer DP-CL provided on the base substrate BS, and a display element layer DP-OEL. In an embodiment, the base substrate BS, the circuit layer DP-CL, and the display element layer DP-OEL may be sequentially stacked in the third direction DR3.

The base substrate BS may be a member for providing a base surface on which the display diode layer DP-OEL is disposed. The base substrate BS may be a glass substrate, a metal substrate, a plastic substrate, etc. However, the embodiments are not limited thereto, and the base substrate BS may be an inorganic layer, an organic layer, or a composite material layer.

In an embodiment, the circuit layer DP-CL may be disposed on the base substrate BS, and the circuit layer DP-CL may include transistors (not shown). Each of the transistors (not shown) may include a control electrode, an input electrode, and an output electrode. For example, the circuit layer DP-CL may include a switching transistor and a driving transistor for driving an organic electroluminescence device OEL (see, e.g., FIG. 8A) of the display element layer DP-OEL.

The light control member CCM may be disposed on the display panel DP. The light control member CCM may include a light control layer CCL, a color filter layer CFL, and a base layer BL. For example, the display panel DP may include the organic electroluminescence device OEL (see, e.g., FIG. 8A) which emits first light, and the light control member CCM may include a light control layer CCL (FIG. 3) which converts the wavelength of the first light provided by the organic electroluminescence device OEL (see, e.g., FIGS. 8A and 8B) or transmits the first light. However, the base layer BL may be omitted.

Figure 3:
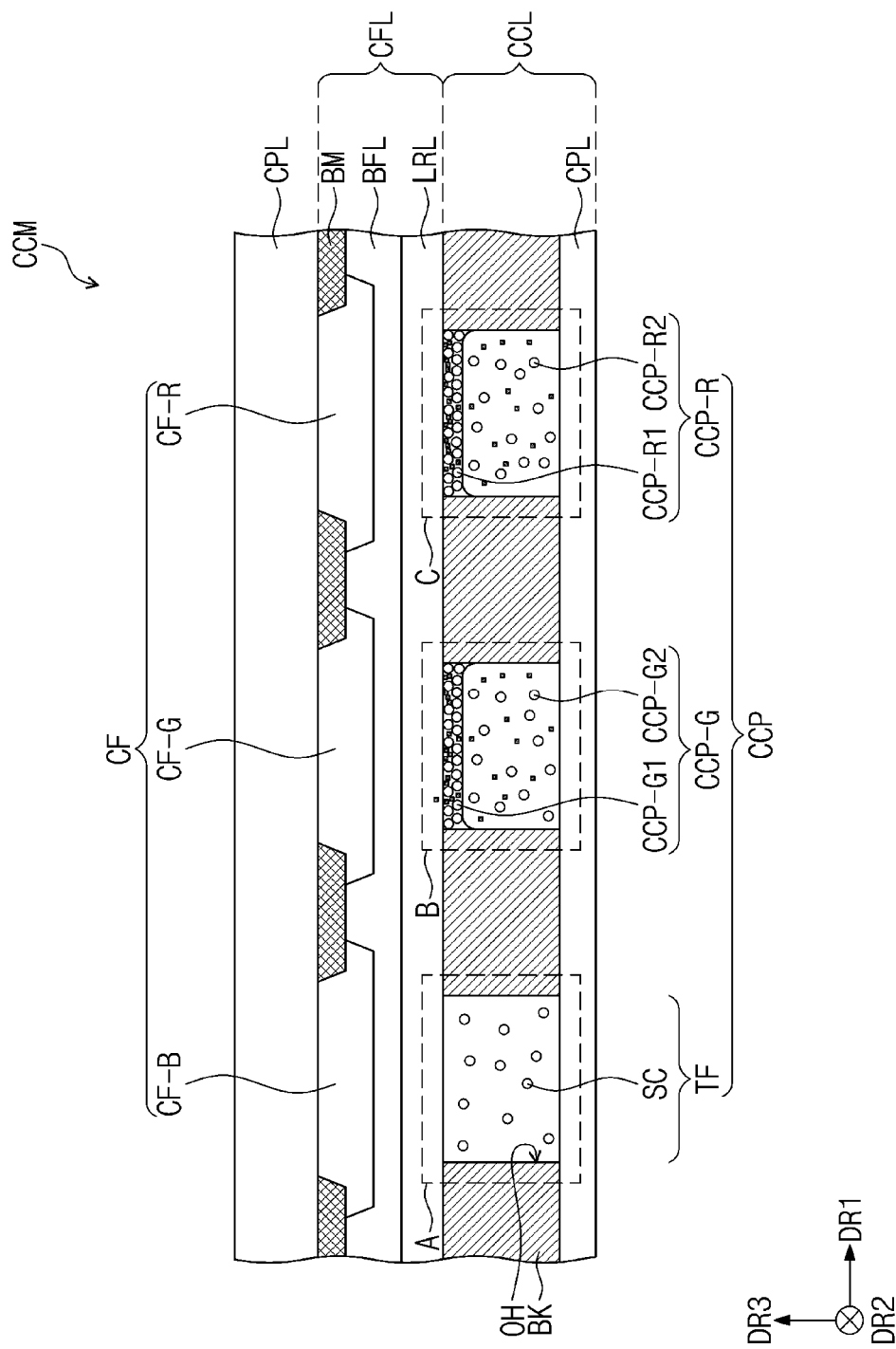
FIG. 3 is a schematic cross-sectional view of a light control member according to an embodiment of the disclosure.
Figure 4A:
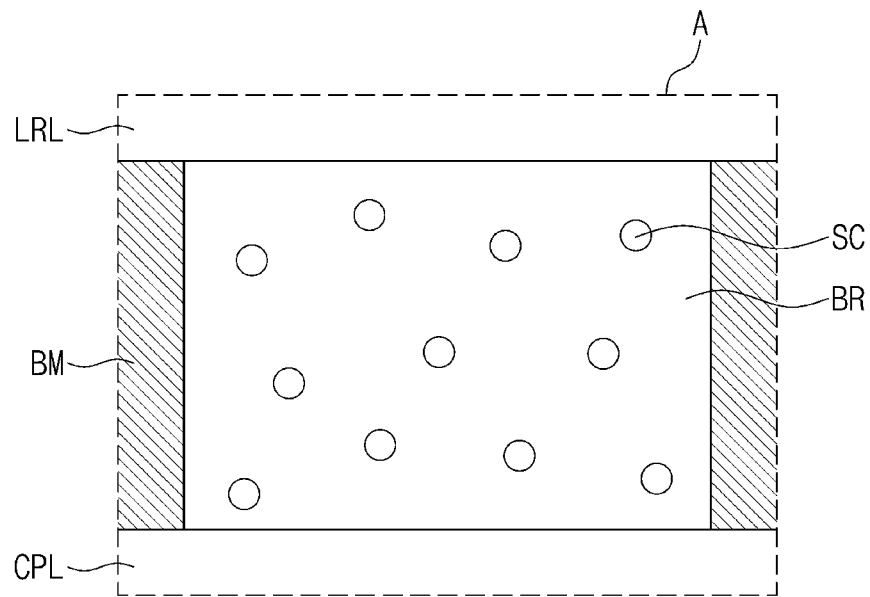
FIGS. 4A to 4C are schematic cross-sectional views illustrating a portion of the light control member according to an embodiment of the disclosure.
Figure 4B:
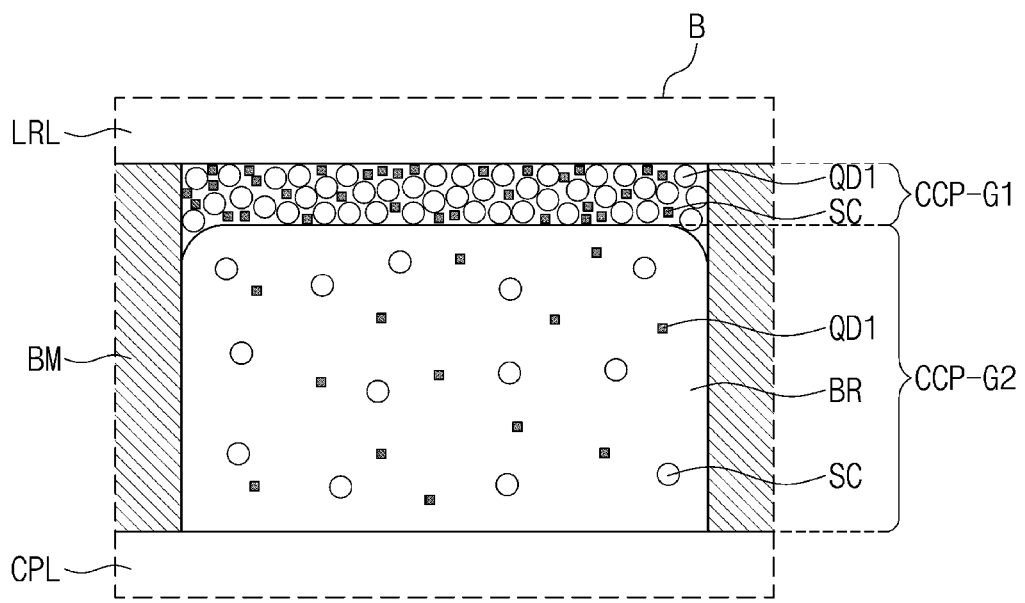
Figure 4C:
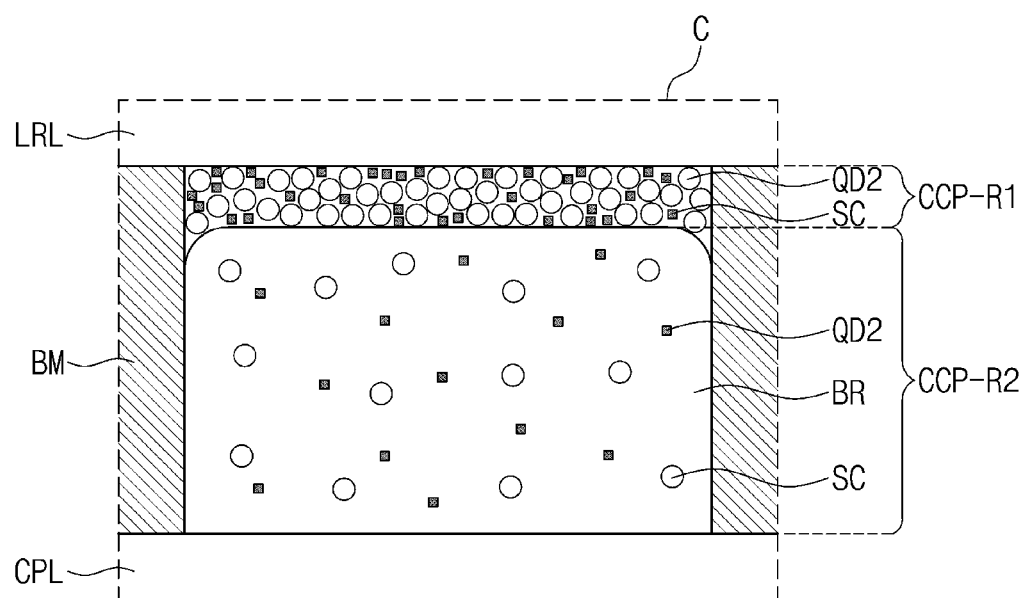

Hereinafter, the light control member CCM will be described in more detail with reference to FIGS. 3 to 4C. FIG. 3 is a schematic cross-sectional view illustrating the light control member CCM according to an embodiment. FIGS. 4A to 4C are schematic cross-sectional views illustrating a portion of the light control member CCM according to an embodiment. FIG. 4A is a schematic enlarged view illustrating a portion A of FIG. 3, FIG. 4B is a schematic enlarged view illustrating a portion B of FIG. 3, and FIG. 4C is a schematic enlarged view illustrating a portion C of FIG. 3.

Referring to FIG. 3, the light control member CCM may include the light control layer CCL including light control units CCP. The light control member CCM may further include a color filter layer CFL and/or a base layer BL. The light control layer CCL, the color filter layer CFL, and the base layer BL may be sequentially stacked in the third direction DR3.

The light control layer CCL may include light control units CCP-G and CCP-R spaced apart from each other. The light control layer CCL may further include a transmission unit TF spaced apart from the light control units CCP-G and CCP-R. The transmission unit TF and the light control units CCP-G and CCP-R may be disposed between partition walls BK spaced apart from each other. However, the embodiments are not limited thereto, some or all of the partition walls BK may be omitted.

The light control layer CCL of an embodiment may include the transmission unit TF, a first light control unit CCP-G and a second light control unit CCP-R. The transmission unit TF may transmit first light, the first light control unit CCP-G may convert the first light into second light, and the second light control unit CCP-R may convert the first light into third light. The second light may have a longer wavelength region than that of the first light, and the third light may have a longer wavelength region than that of the first light and the second light. For example, the first light may be blue light, the second light may be green light, and the third light may be red light. The first light may have a wavelength region of about 410 nm to about 480 nm, the second light may have a wavelength region of about 500 nm to about 570 nm, and the third light may have a wavelength region of about 625 nm to about 675 nm. The first light may be source light provided from the display panel DP (FIG. 2) to the light control layer CCL.

The transmission unit TF may transmit the wavelength of the first light without conversion. The first light control unit CCP-G and the second light control unit CCP-R may include light emitters. The light emitters may be particles which convert the wavelength of the incident light and emit light having another wavelength. In an embodiment, the light emitter included in the first light control unit CCP-G and the second light control unit CCP-R may be a quantum dot.

The quantum dot may be a particle which converts the wavelength of the light provided. The quantum dot may be selected from among a Group II-VI compound, a Group III-V compound, a Group IV-VI compound, a Group IV element, a Group IV compound, and a combination thereof.

The Group II-VI compound may be selected from the group consisting of a binary compound selected from the group consisting of CdSe, CdTe, ZnS, ZnSe, ZnTe, ZnO, HgS, HgSe, HgTe, MgSe, MgS, and a mixture thereof, a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof, and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The Group III-VI compound may include a binary compound such as $In_2S_3$ and $In_2Se_3$, a ternary compound such as $InGaS_3$ and $InGaSe_3$, or any combination thereof.

The Group III-V compound may be selected from the group consisting of a binary compound selected from the group consisting of GaN, GaP, GaAs, GaSb, AlN, AlP, AlAs, AlSb, InN, InP, InAs, InSb, and a mixture thereof, a ternary compound selected from the group consisting of GaNP, GaNAs, GaNSb, GaPAs, GaPSb, AlNP, AlNAs, AlNSb, AlPAs, AlPSb, InNP, InAlP, InNAs, InNSb, InPAs, InPSb, GaAlNP, and a mixture thereof, and a quaternary compound selected from the group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof. The Group III-V semiconductor compound may further include Group II metal (e.g., InZnP, etc.)

A Group IV-VI compound may be selected from the group consisting of a binary compound selected from the group consisting of SnS, SnSe, SnTe, PbS, PbSe, PbTe, and a mixture thereof, a ternary compound selected from the group consisting of SnSeS, SnSeTe, SnSTe, PbSeS, PbSeTe, PbSTe, SnPbS, SnPbSe, SnPbTe, and a mixture thereof, and a quaternary compound selected from the group consisting of SnPbSSe, SnPbSeTe, SnPbSTe, and a mixture thereof. A Group IV element may be selected from the group consisting of Si, Ge, and a mixture thereof. The Group IV compound may be a binary compound selected from the group consisting of SiC, SiGe, and a mixture thereof.

The Group semiconductor compound may include a ternary compound such as AgInS, $AgInS_2$, CuInS, $CuInS_2$, $CuGaO_2$, $AgGaO_2$, and $AgAlO_2$, or any combination thereof.

In this case, a binary compound, a ternary compound, or a quaternary compound may be present in a particle with a uniform concentration distribution or may be present in the same particle with a partially different concentration distribution.

The quantum dot may have a core-shell structure including a core and a shell surrounding the core. The quantum dot may have a core-shell structure in which a quantum dot surrounds another quantum dot. An interface between a core and a shell may have a concentration gradient in which the concentration of an element present in the shell becomes lower toward the center thereof.

In an embodiment, the quantum dot may have the above-described core-shell structure including a core having nanocrystals and a shell surrounding the core. The shell of the quantum dot may serve as a protective layer to prevent the chemical deformation of the core so as to maintain semiconductor properties, and/or a charging layer to impart electrophoresis properties to the quantum dot. The shell may be a single layer or multiple layers. An interface between a core and a shell may have a concentration gradient in which the concentration of an element present in the shell becomes lower toward the center thereof. An example of the shell of the quantum dot may include a metal or non-metal oxide, a semiconductor compound, or a combination thereof.

For example, the metal or non-metal oxide used in the shell may be a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and NiO, or a ternary compound such as $MgAl_2O_4$, $CoFe_2O_4$, $NiFe_2O_4$, and $CoMn_2O_4$, but the embodiments are not limited thereto.

The semiconductor compound may be, for example, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or the like, but the embodiments are not limited thereto.

The quantum dot may have a full width at half maximum (FWHM) of a light emission wavelength spectrum of about 45 nm or less, about 40 nm or less, or about 30 nm or less. The color purity or color reproducibility may be improved in the above range. Light emitted through such a quantum dot may be emitted in all directions so that a wide viewing angle may be improved.

Although the form of the quantum dot is not particularly limited as long as it is a form available in the art, more specifically, the quantum dot in the form of a spherical, pyramidal, or multi-arm shape, or cubic nanoparticles, nanotubes, nanowires, nanofibers, nanoparticles, etc. may be used.

The quantum dot may control the color of emitted light according to the particle size thereof. Accordingly, the quantum dot may have various light emission colors such as blue, red, and green. The smaller the particle size of the quantum dot becomes, the shorter the wavelength of light being emitted may be. For example, the particle size of the quantum dot emitting green light may be smaller than the particle size of the quantum dot emitting red light.

At least one among the light control units CCP-G and CCP-R may have layers. In an embodiment, the first light control unit CCP-G and the second light control unit CCP-R may include a first region CCP-G1 and CCP-R1 and a second region CCP-G2 and CCP-R2, respectively. Detailed structures of the transmission unit TF and light control units CCP-G and CCP-R will be described below with reference to FIGS. 4A to 4C.

The partition walls BK may each define an opening OH so that a region thereof overlapping the color filter CF is exposed. The transmission unit TF and the light control units CCP-G and CCP-R may fill the opening OH.

Referring to FIG. 4A, the transmission unit TF may include scattering particles SC dispersed in an organic polymer BR. The scattering particles SC may be $TiO_2$, silica-based nanoparticles, or the like. The scattering particles SC may be particles which scatter light, thereby increasing light output efficiency. The scattering particles SC may be uniformly dispersed in the organic polymer BR. As described below, the transmission unit TF may be generated by an inkjet injection step and thus may be formed in a region in which the concentration of the inorganic material is not separated. However, the embodiments are not limited thereto, the transmission unit TF may include a first region and a second region, similar to the light control units CCP-G and CCP-R.

Referring to FIGS. 4B and 4C, the light control units CCP-G and CCP-R each may include the first region CCP-G1 and CCP-R1 and the second region CCP-G2 and CCP-R2. The first region CCP-G1 and CCP-R1 may be disposed adjacent to the color filter layer CFL, and the second region CCP-G2 and CCP-R2 may be disposed below the first region CCP-G1 and CCP-R1, thereby being spaced apart from the color filter layer CFL.

The thickness of the second region CCP-G2 and CCP-R2 may be greater than that of the first region CCP-G1 and CCP-R1. Specifically, the thickness ratio of the second region CCP-G2 and CCP-R2 to the first region CCP-G1 and CCP-R1 may be in a range of about 1:1.5 to about 1:200. As another example, the thickness ratio may be about 1:2 or greater, about 1:3 or greater, and about 1:100 or less. For example, the thickness of the first region CCP-G1 and CCP-R1 may be in a range of about 0.1 μm to about 5 μm.

The thickness of the second region CCP-G2 and CCP-R2 may be in a range of about 5 μm to about 20 μm.

The first region CCP-G1 and CCP-R1 may include a relatively high concentration of an inorganic material, and the second region CCP-G2 and CCP-R2 may include a relatively low concentration of an inorganic material. For example, the concentration ratio of the inorganic material in the second region CCP-G2 and CCP-R2 to the first region CCP-G1 and CCP-R1 may be in a range of about 1:1.5 to about 1:20. The inorganic material may be, for example, the above-described light emitters QD1 and QD2 and scattering particles SC. Therefore, the higher the concentration of the inorganic material is, the more the light conversion efficiency of the light conversion member may be improved, and the more display quality of the display apparatus ES may be improved. The display apparatus ES of an embodiment may have desired display quality by including the light conversion member having the region containing the high concentration of the inorganic material.

The first region CCP-G1 and CCP-R1 may include organic monomers and the inorganic material, for example, light emitters QD1 and QD2 and scattering particles SC. Most of the organic monomers included in the first region CCP-G1 and CCP-R1 may be decomposed in a heat process described below, and a very small amount of the organic monomers may be included. For example, the organic monomers less than about 10% with respect to the total volume of the first region CCP-G1 and CCP-R1 may be included. The lower limit of the volume of the organic monomer is not particularly limited, but a small amount of about 0.01% or greater may be included.

The volume occupied by the light emitters QD1 and QD2 in the first region CCP-G1 and CCP-R1 may be greater than the volume occupied by the light emitters QD1 and QD2 in the second region CCP-G2 and CCP-R2. The volume of the light emitters QD1 and QD2 included in the first region CCP-G1 and CCP-R1 may be in a range of about 10% to about 99.9% with respect to the total volume of the first region CCP-G1 and CCP-R1. In another embodiment, the volume of the light emitters QD1 and QD2 included in the first region CCP-G1 and CCP-R1 may be about 15% or greater, or about 20% or greater with respect to the total volume of the first region CCP-G1 and CCP-R1.

The second region CCP-G2 and CCP-R2 may include an organic polymer BR and the inorganic material, for example, light emitters QD1 and QD2 and scattering particles SC. The organic polymer may be a medium in which the light emitters QD1 and QD2 and the scattering particles SC are dispersed and may generally mean a binder. The base resin may be a polymer resin. The organic polymer BR may be a polymer generated by a photocuring reaction of the organic monomers included in the first region CCP-G1 and CCP-R1. For example, the organic polymer BR may be an acrylic resin, a urethane resin, a silicone resin, an epoxy resin, etc. The organic polymer BR may be a transparent resin. The volume of the organic polymer BR may be in a range of about 10% to about 90% with respect to the total volume of the second region CCP-G2 and CCP-R2.

The volume occupied by the light emitters QD1 and QD2 in the second region CCP-G2 and CCP-R2 may be smaller than the volume occupied by the light emitters QD1 and QD2 in the first region CCP-G1 and CCP-R1. For example, the volume of the light emitters QD1 and QD2 included in the second region CCP-G2 and CCP-R2 may be in a range of about 5% to about 50% with respect to the total volume of the second region CCP-G2 and CCP-R2.

The first light emitters QD1 included in the first region CCP-G1 and the second region CCP-G2 in the first light control unit CCP-G may be the same as each other. The second light emitters QD2 included in the first region CCP-R1 and the second region CCP-R2 in the second light control unit CCP-R may be the same as each other. However, the embodiments are not limited thereto. For example, the light emitters may be different from each other.

The first emitters QD1 and the second emitters QD2 may be different from each other. For example, the particle sizes of the first light emitters QD1 and the second light emitters QD2 may be different from each other. For example, the particle sizes of the first light emitters QD1 may be smaller than those of the second light emitters QD2. In this case, the first light emitters QD1 may emit light having a shorter wavelength than the second light emitters QD2.

Referring back to FIG. 3, the light control member CCM according to an embodiment may further include the color filter layer CFL disposed on the light control layer CCL. In an embodiment, the color filter layer CFL may disposed between the base layer BL and the light control layer CCL. The color filter layer CFL may include a light shielding unit BM and a color filter CF.

The light shielding unit BM may be disposed on the base layer BL. Light shielding units BM may be spaced apart from each other while exposing a portion of the base layer BL. Color filters CF-B, CF-G, and CF-R may be disposed between the light shielding units BM.

The color filter layer CFL may include the color filters CF-B, CF-G, and CF-R disposed adjacent to each other on a plane or layer. For example, the color filter layer CFL may include a first color filter CF-B configured to transmit the first light, a second color filter CF-G configured to transmit the second light, and a third color filter CF-R configured to transmit the third light. For example, the first color filter CF-B may be a blue color filter, the second color filter CF-G may be a green color filter, and the third color filter CF-R may be a red color filter.

The color filters CF-B, CF-G, and CF-R each may include a polymeric photosensitive resin and a pigment or dye. The first color filter CF-B may include a blue pigment or dye, the second color filter CF-G may include a green pigment or dye, and the third color filter CF-R may include a red pigment or dye.

However, the embodiments are not limited thereto. For example, the first color filter CF-B may not include a pigment or dye. The first color filter CF-B may include a polymeric photosensitive resin and may not include a pigment or dye. The first color filter CF-B may be transparent. The first color filter CF-B may be formed of a transparent photosensitive resin.

The light shielding unit BM may be a black matrix. The light shielding unit BM may include an organic light shielding material or an inorganic light shielding material containing a black pigment or dye. The light shielding unit BM may prevent light leakage and may separate boundaries between the adjacent color filters CF-B, CF-G, and CF-R.

The light shielding units BM may be spaced apart from each other, and each of the light shielding units BM may overlap corresponding one of the multiple partition walls BK.

The color filter layer CFL may further include a low refractive layer LRL. The low refractive layer LRL may be disposed between the color filter CF and the light control layer CCL. The low refractive layer LRL may have a refractive index in a range of about 1.1 to about 1.5. The refractive index of the low refractive layer LRL may be adjusted by the ratio of hollow inorganic particles and/or voids, etc. included in the low refractive layer LRL.

The color filter layer CFL may further include a buffer layer BFL. FIG. 3 illustrates that the buffer layer BFL is disposed between the color filter CF and the low refractive layer LRL, but the embodiments are not limited thereto. For example, the buffer layer BFL may be disposed adjacent to the light control layer CCL on the low refractive layer LRL. The buffer layer BFL may be a protective layer which protects the low refractive layer LRL or the color filter CF. The buffer layer BFL may be an inorganic material layer containing at least one inorganic material selected from among silicon nitride, silicon oxide, and silicon oxynitride. The buffer layer BFL may be formed of a single layer or multiple layers.

The base layer BL may be a member configured to provide a base surface on which the color filter layer CFL, the light control layer CCL, and the like are disposed. The base layer BL may be a glass substrate, a metal substrate, a plastic substrate, etc. However, the embodiments are not limited thereto, and the base layer BL may be an inorganic layer, an organic layer, or a composite material layer.

The light control layer CCL may further include a capping layer CPL. The capping layer CPL may be disposed on the light control unit CCP and the partition wall BK. The capping layer CPL may prevent the penetration of moisture and/or oxygen (hereinafter referred to as "moisture/oxygen"). The capping layer CPL may be disposed on the light control unit CCP to prevent the light control unit CCP from being exposed to moisture/oxygen. The capping layer CPL may include at least one inorganic layer. For example, the capping layer CPL may include an inorganic material. For example, the capping layer CPL may include silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride, or a metal thin film which secures light transmittance. The capping layer CPL may further include an organic film. The capping layer CPL may be formed of a single layer or multiple layers.

FIGS. 5A to 5D are cross-sectional views illustrating some steps of a method for manufacturing a display apparatus ES according to an embodiment. FIGS. 5A to 5D sequentially illustrate steps for forming a light control member CCM according to an embodiment. FIGS. 6A and 6B illustrate a portion of an intermediate light control unit after the step of FIG. 5C in the step for forming the light control member CCM. Hereinafter, the same reference numeral may be given to the same components as those described above with reference to FIGS. 1 to 4C, and detailed descriptions thereof will be omitted.

Although not illustrated, the method for manufacturing the display apparatus ES according to an embodiment may include preparing the display panel DP and forming the light control member CCM on the display panel DP.

Figure 5A:
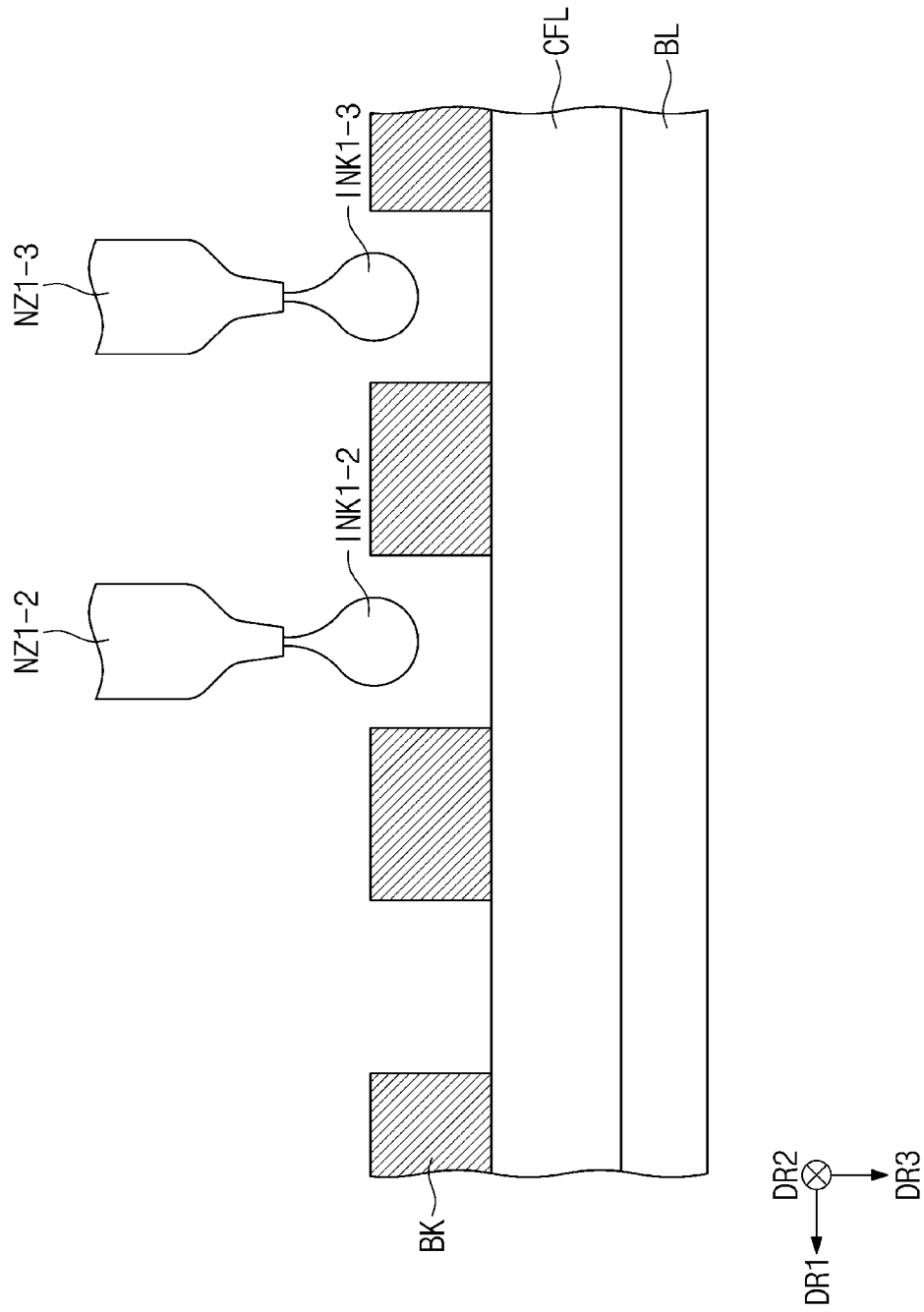
FIGS. 5A to 5D are schematic cross-sectional views illustrating some steps in a method for manufacturing a display apparatus according to an embodiment of the disclosure.
Figure 5B:
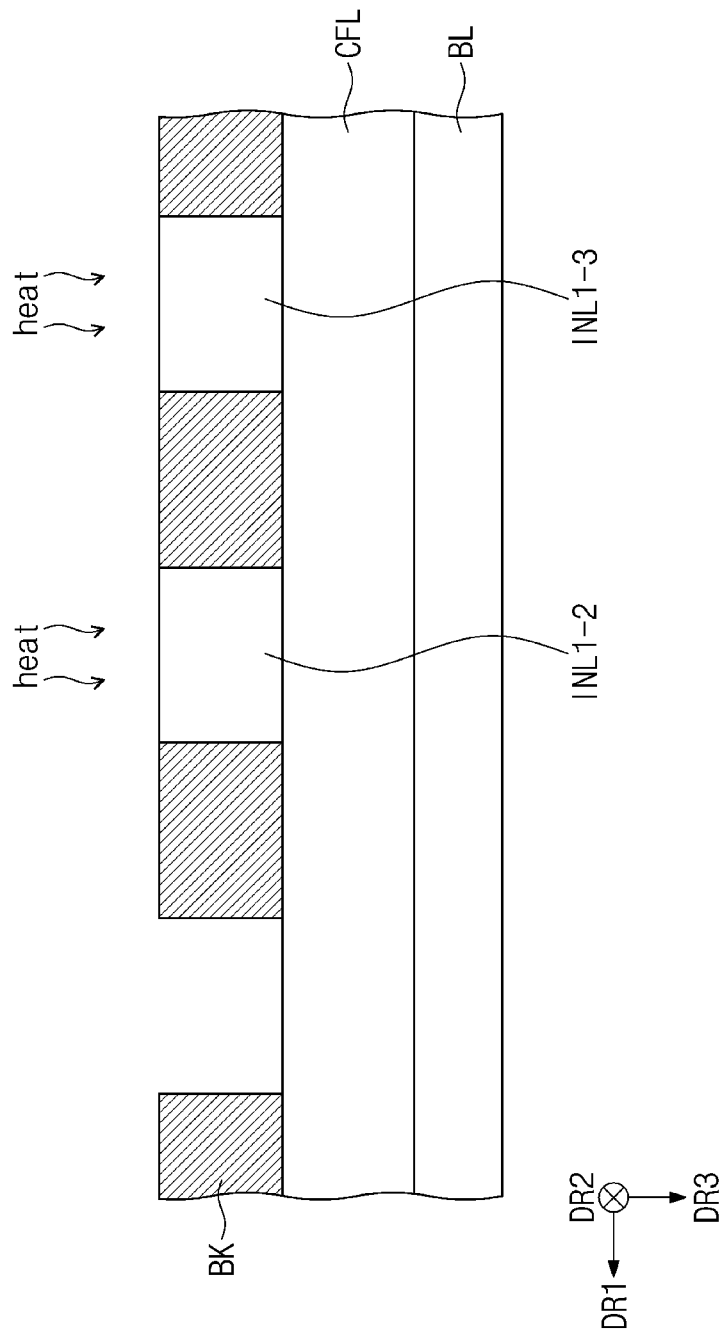
Figure 6A:
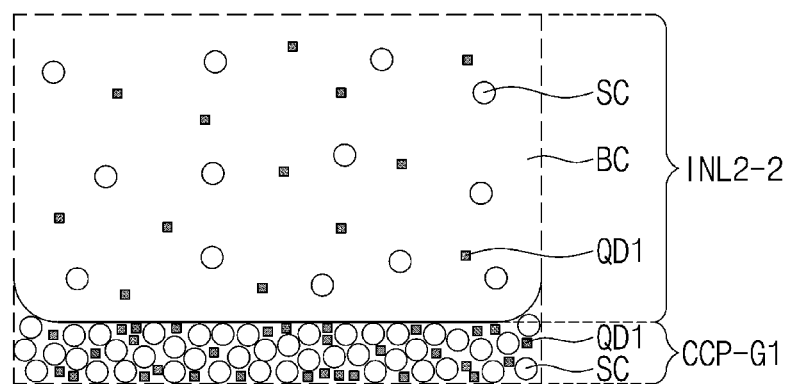
FIGS. 6A and 6B are schematic enlarged cross-sectional views illustrating some steps in the method for manufacturing the display apparatus according to an embodiment of the disclosure.
Figure 6B:
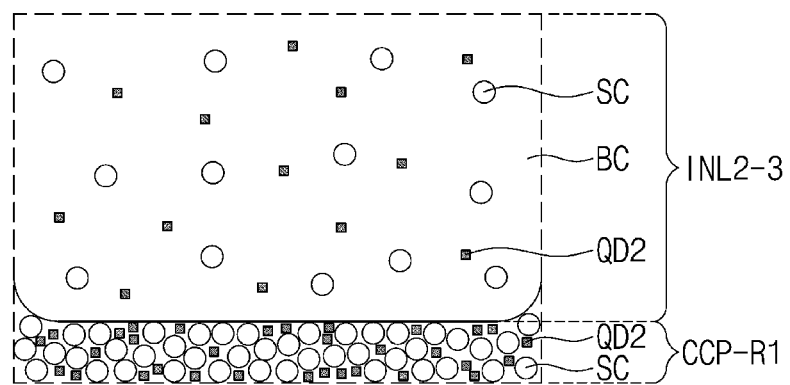

Referring to FIGS. 5A and 5B, the forming of the light control member CCM according to an embodiment may include providing first inks INK1-2 and INK1-3 on a color filter layer CFL to form first ink layers INL1-2 and INL1-3. First inks INK1-1, INK1-2, and INK1-3 may be applied via first nozzles NZ1-2 and NZ1-3.

Although not shown, before the forming of the first ink layers INL1-2 and INL1-3, forming the color filter layer CFL and disposing partition walls BK on the color filter layer CFL may be performed.

The forming of the color filter layer CFL may include forming the first color filter CF-B, the second color filter CF-G, and the third color filter CF-R (see, e.g., FIG. 3) disposed adjacent to each other on a plane.

The disposing of the partition walls BK may be disposing, on the color filter layer CFL, the partition walls BK to be spaced apart from each other. The partition walls BK may be spaced apart from each other so that openings are formed in regions overlapping the first color filter CF-B, the second color filter CF-G, and the third color filter CF-R.

The first inks INK1-2 and INK1-3 may include a second sub-ink INK1-2 and a third sub-ink INK1-3, and the second sub-ink INK1-2 and the third sub-ink INK1-3 each may be dropped between the partition walls BK. The first inks INK1-2 and INK1-3 may be dropped at the same height as the partition walls BK to form the first ink layers INL1-2 and INL1-3. However, the dropped amount of the first inks INK1-2 and INK1-3 may be adjusted as needed.

The second sub ink INK1-2 and the third sub ink INK1-3 may be dropped between the partition walls BK via separate nozzles NZ1-2 and NZ1-3, respectively. The second sub-ink INK1-2 may form a 1-2-th pattern ink layer INL1-2, and the third sub-ink INK1-3 may form a 1-3-th pattern ink layer INL1-3.

The first inks INK1-2 and INK1-3 and the first ink layers INL1-2 and INL1-3 formed by the first inks INK1-2 and INK1-3 may include an organic monomer, a light emitter, and a photoinitiator. However, the embodiments are not limited thereto. For example, scattering particles, an organic solvent, additives, or the like may be included as needed. The first inks INK1-2 and INK1-3 may be a photocurable composition.

Referring to FIG. 5B, first regions CCP-G1 and CCP-R1 may be formed by providing heat onto the first ink layers INL1-2 and INL1-3. In this case, the applied heat may have a temperature in a range of about 150° C. to about 200° C. When heat is applied to the first ink layers INL1-2 and INL1-3, a curing reaction of the first inks INK1-2 and INK1-3, which are photocurable compositions, may not be performed, and a decomposition reaction and a phase-transition reaction of an organic material such as an organic monomer may be performed. Therefore, the formed first regions CCP-G1 and CCP-R1 may have a smaller thickness and volume than those of the first ink layers INL1-2 and INL1-3, and the ratio occupied by light emitters QD1 and QD2 in the first regions CCP-G1 and CCP-R1 may be increased. The steps in FIGS. 5A and 5B may be repeatedly carried out at least two times as needed. As the steps in FIGS. 5A and 5B are repeated, the thickness of the first regions CCP-G1 and CCP-R1 may be increased, and the luminous efficiency of the display apparatus ES may be improved.

Figure 5C:
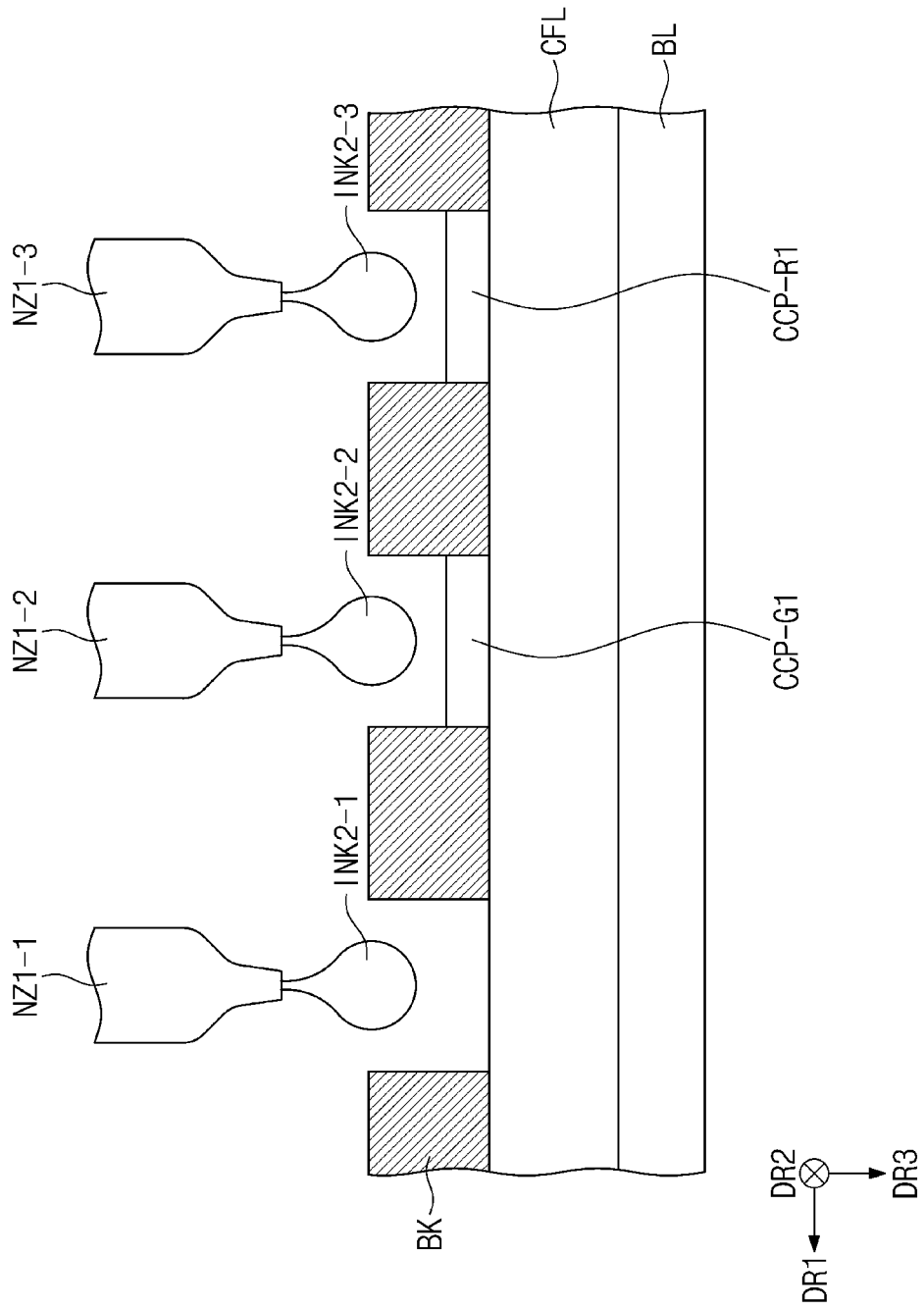
Figure 5D:
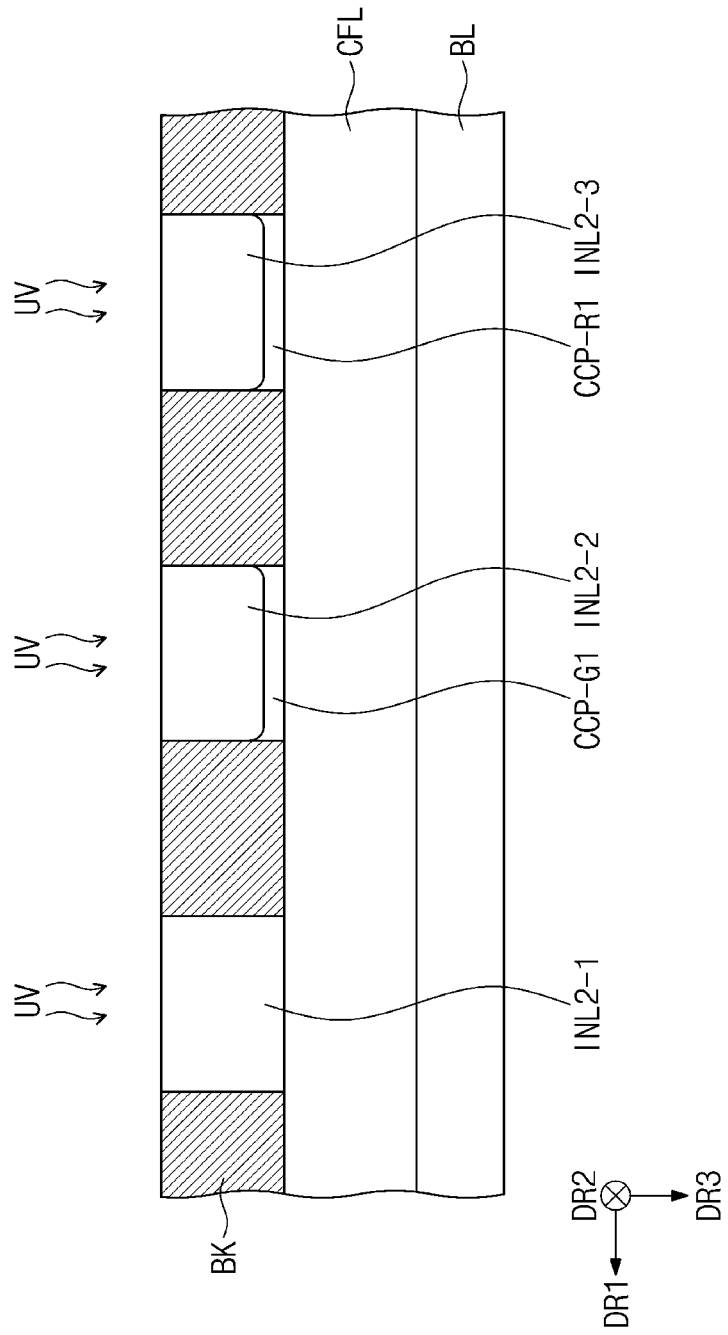

Referring to FIGS. 5C and 5D, second ink layers INL2-1, INL2-2, and INL2-3 may be formed by providing second inks INK2-1, INK2-2, and INK2-3 onto the color filter layer CFL and the first ink layers INL1-2 and INL1-3. The second inks INK2-1, INK2-2, and INK2-3 may include first sub-ink INK2-1, second sub-ink INK2-2, and third sub-ink INK2-3. The second ink layers INL2-1, INL2-2, and INL2-3 may include a 2-1-th pattern ink layer INL2-1, a 2-2-th pattern ink layer INL2-2, and a 2-3-th pattern ink layer INL2-3. The second sub-ink INK2-2 and the third sub-ink INK2-3 of the second ink may be identical to the second sub-ink INK1-2 and the third sub-ink INK1-3 of the first ink INK1-2, INK1-3. The first to third sub-inks INK2-1, INK2-2, and INK2-3 may be dropped between the partition walls BK via separate second nozzles NZ1-1, NZ1-2, and NZ1-3, respectively.

The nozzles NZ1-2 and NZ1-3 via which the second sub-ink INK2-2 and the third sub-ink INK2-3 of the second inks are dropped may be the same as those used in the forming of the first ink layers INL1-2 and INL1-3.

The first sub-ink INK1-1 may be dropped on the color filter layer CFL to form the 2-1-th pattern ink layer INL2-1. The first sub-ink INK1-1 may be dropped at the same height as the partition walls BK to form the 1-2-th pattern ink layer INL1-2.

Referring to FIGS. 6A and 6B, the second sub-ink INK2-2 and the third sub-ink INK2-3 may be dropped onto the first regions CCP-G1 and CCP-R1, respectively, to form the 2-2-th pattern ink layer INL2-2 and the 2-3-th pattern ink layer INL2-3. The 2-2-th pattern ink layer INL2-2 and the 2-3-th pattern ink layer INL2-3 may include an organic composition BC containing organic monomers and a photoinitiator, and light emitters QD1 and QD2 dispersed in the organic composition BC. The 1-2-th pattern ink layer INL1-2 and the 1-3-th pattern ink layer INL1-3 may further include scattering particles SC dispersed in the organic composition BC. On the other hand, the first regions CCP-G1 and CCP-R1 may have none or a small amount of the organic composition BC and may have a higher concentration of the light emitters QD1 and QD2 and the scatterers SC.

Referring back to FIG. 5D, the second ink layers INL2-1, INL2-2, and INL2-3 may be cured by irradiating UV rays. Although not shown, after irradiating UV rays to the second ink layers INL1-1, INL1-2, and INL1-3, providing heat may be further included.

The organic monomers may be polymerized by the photoinitiator absorbing UV rays to form an organic polymer. Therefore, the second regions CCP-G2 and CCP-R2 (see, e.g., FIG. 3) may be formed at a similar height to that of the 2-2-th pattern ink layer INL2-2 and the 2-3-th pattern ink layer INL2-3. For example, the second regions CCP-G2 and CCP-R2 may be thicker than the first regions CCP-G1 and CCP-R1 (see, e.g., FIG. 3), and portions occupied by the light emitters QD1 and QD2 in the second regions CCP-G2 and CCP-R2 may be relatively smaller than those occupied by the light emitters QD1 and QD2 in the first regions CCP-G1 and CCP-R1.

The method for manufacturing the light control member included in the display apparatus of an embodiment may include a method for manufacturing the light control unit including the first region and the second region by primarily dropping inks and subjecting the same to a heat process and then secondarily dropping inks and curing the same. Accordingly, the display quality of the display apparatus may be improved by including a region containing a relatively high concentration of light emitters. Moreover, manufacturing costs may be reduced and the luminous efficiency equal or superior to that of a conventional display apparatus may be achieved even when the thickness of the light control member or the quantity of the light emitters is reduced.

Figure 7:
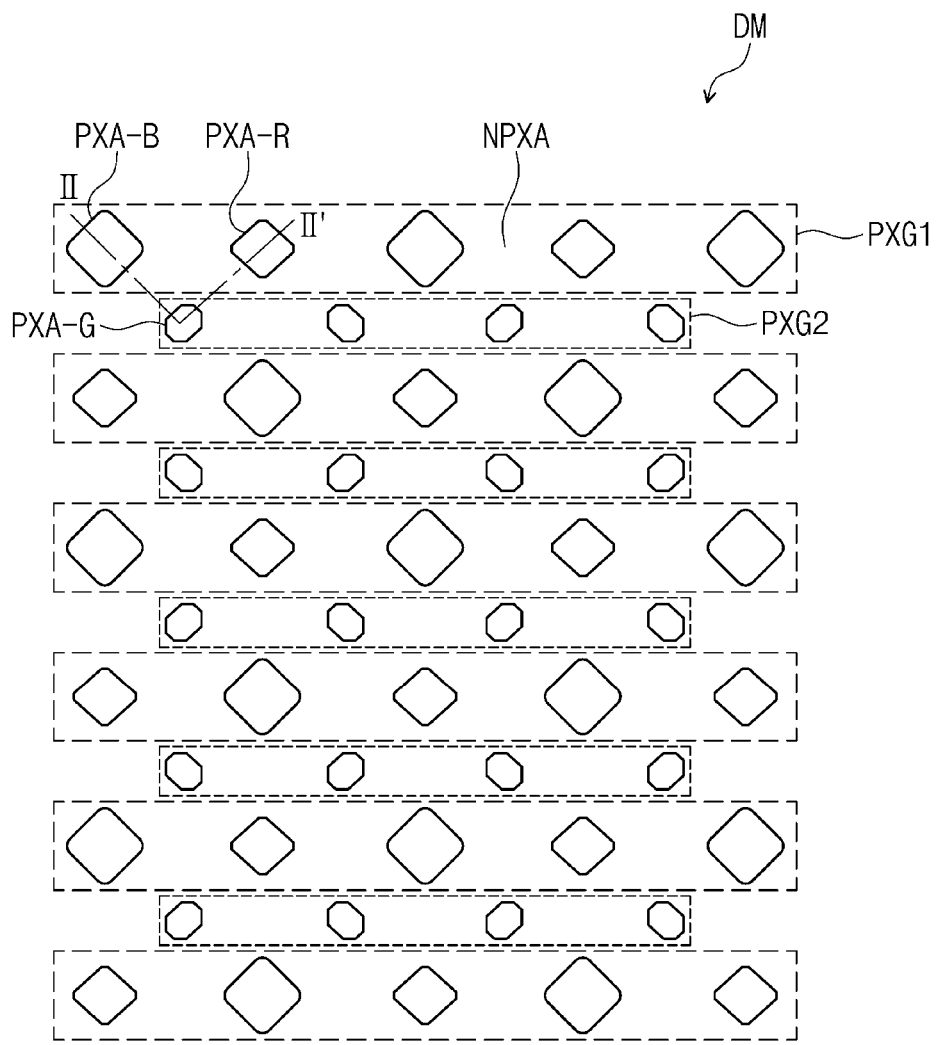
FIG. 7 is a schematic enlarged plan view illustrating a portion of the display module included in the display apparatus according to an embodiment of the disclosure.
Figure 8A:
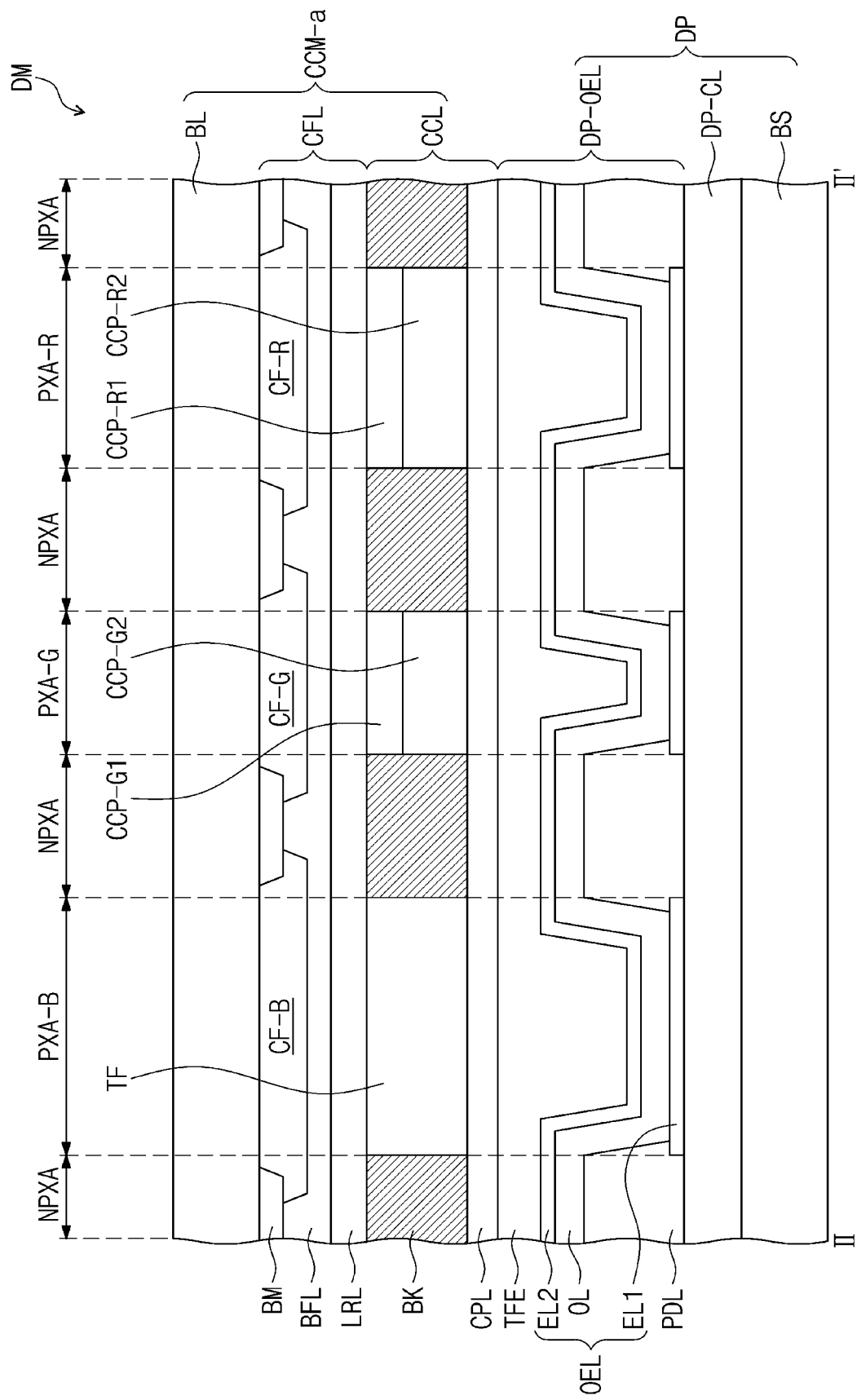
FIGS. 8A and 8B are schematic enlarged cross-sectional views illustrating a portion of the display module included in the display apparatus according to an embodiment of the disclosure.
Figure 8B:
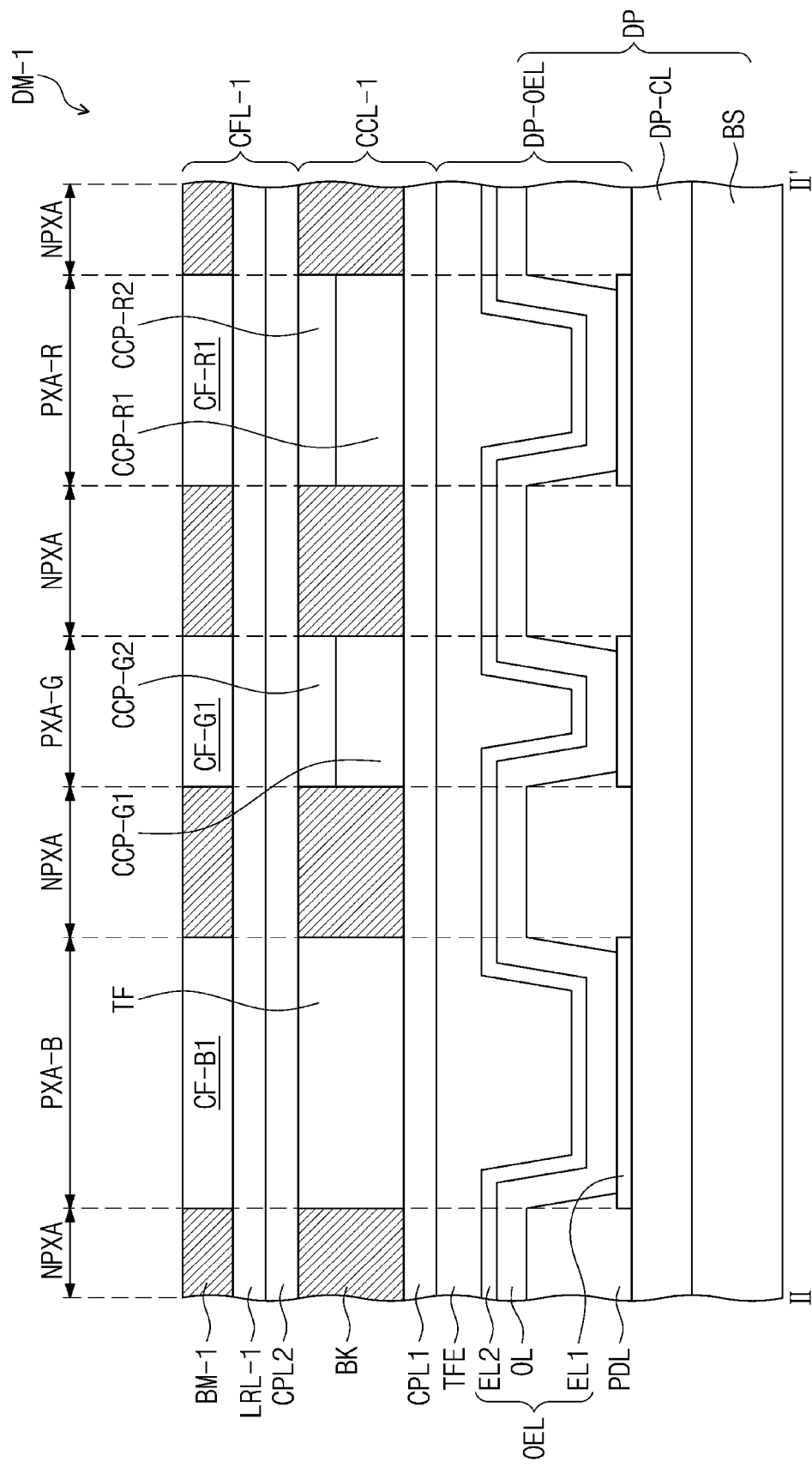

FIG. 7 is a schematic enlarged plan view illustrating a portion of the display module included in the display apparatus according to an embodiment. FIGS. 8A and 8B are schematic enlarged cross-sectional views illustrating a portion of the display module included in the display apparatus according to an embodiment. FIGS. 8A and 8B show a part taken along line II-II' of FIG. 7.

Hereinafter, the display module DM of an embodiment described with reference to FIGS. 7, 8A, and 8B may be included in the display apparatus ES of the embodiment described in FIG. 1, the display module DM may include the display panel DP and a light control member CCM-a, and those described with reference to FIGS. 3 to 6B may be equally applied to the light control member CCM-a.

The display module DM may include non-light emitting regions NPXA and light emitting regions PXA-R, PXA-G, and PXA-B. The light emitting regions PXA-R, PXA-G, and PXA-B each may be a region in which light generated by the organic electroluminescence device OEL is emitted. Areas of the light emitting regions PXA-R, PXA-G, and PXA-B may be different from each other in a plan view.

The light emitting regions PXA-B, PXA-G, and PXA-R may be divided into groups depending on the color of light. FIG. 8A illustrates that the display module DM includes three light emitting regions PXA-B, PXA-G, and PXA-R which emit blue light, green light, and red light, respectively. For example, the display apparatus ES (see, e.g., FIG. 1) of an embodiment may include a blue light emitting region PXA-B, a green light emitting region PXA-G, and a red light emitting region PXA-R which are distinguishable.

FIGS. 8A and 8B illustrate that the display module DM of an embodiment includes the display panel DP including the organic electroluminescence device OEL including the organic layer OL as a common layer. For example, in the display module DM of an embodiment illustrated in FIGS. 8A and 8B, the display panel DP may emit light having the same wavelength regardless of the light emitting regions PXA-B, PXA-G, and PXA-R of the display module DM. For example, the display panel DP may provide the blue light, which is the first light, to the light control member CCM-a.

In the display module DM of an embodiment, the light emitting regions PXA-B, PXA-G, and PXA-R may have different area depending on the color emitted from the light control units CCP-G and CCP-R and the transmission unit TF. For example, in the display module DM of an embodiment, the blue light emitting region PXA-B corresponding to the transmission unit TF which transmits the blue light may have the largest area, and the green light emitting region PXA-G corresponding to the first light control unit CCP-G which generates and emits the green light may have the smallest area. However, the embodiments are not limited thereto. For example, the light emitting regions PXA-B, PXA-G, and PXA-R may emit different colors of light other than the blue light, green light, and red light, and may have the same area as each other, or may be provided in a different area ratio from the PXA-R, PXA-G, and PXA-B illustrated in FIG. 7.

Each of the light emitting regions PXA-B, PXA-G, and PXA-R may be a region divided by a pixel defining film PDL. The non-light emitting regions NPXA may be regions between the adjacent light emitting regions PXA-B, PXA-G, and PXA-R, which correspond to the pixel defining film PDL.

Referring to FIG. 7, the blue light emitting regions PXA-B and the red light emitting regions PXA-R may be alternately arranged in the first direction DR1 to form a first group PXG1. The green light emitting regions PXA-G may be arranged in the first direction DR1 to form a second group PXG2.

The first group PXG1 may be spaced apart from the second group PXG2 in the second direction DR2. There may be multiple first groups PXG1 and multiple second groups PXG2. The first groups PXG1 and the second groups PXG2 may be alternately arranged with respect to each other in the second direction DR2.

A green light emitting region PXA-G may be spaced apart from a blue light emitting region PXA-B or a red light emitting region PXA-R in a fourth direction DR4. The fourth direction DR4 may be between the first direction DR1 and the second direction DR2.

The arrangement structure of the light emitting regions PXA-B, PXA-G, and PXA-R shown in FIG. 7 may be referred to as a Pentile® structure. However, the arrangement structure of the light emitting regions PXA-B, PXA-G, and PXA-R in the display module DM according to an embodiment is not limited to the arrangement structure shown in FIG. 7. For example, in an embodiment, the light emitting regions PXA-B, PXA-G, and PXA-R may have a stripe structure in which the blue light emitting region PXA-B, the green light emitting region PXA-G, and the red light emitting region PXA-R are sequentially and alternately arranged in the first direction DR1.

Referring to FIGS. 8A and 8B, the display panel DP according to an embodiment may include a base substrate BS, a circuit layer DP-CL disposed on the base substrate BS, and a display element layer DP-OEL disposed on the circuit layer DP-CL. The display element layer DP-OEL may include pixel defining films PDL, the organic electroluminescence device OEL disposed between the pixel defining films PDL, and a thin film encapsulation layer TFE disposed on the organic electroluminescence device OEL.

The pixel defining films PDL may be formed of a polymer resin. For example, the pixel defining films PDL may include a polyacrylate-based resin or a polyimide-based resin. The pixel defining films PDL may further include an inorganic material in addition to the polymer resin. The pixel defining films PDL may include a light absorbing material or may include a black pigment or a black dye. The pixel defining films PDL may be formed of an inorganic material. For example, the pixel defining films PDL may include silicon nitride ($SiN_x$), silicon oxide ($SiO_x$), silicon oxynitride ($SiO_xN_y$), or the like. The pixel defining film PDL may define the light emitting regions PXA-B, PXA-G, and PXA-R. The light emitting regions PXA-B, PXA-G, and PXA-R and the non-light emitting regions NPXA may be divided by the pixel defining films PDL.

The pixel defining films PDL may overlap the partition walls BK. For example, each of the pixel defining films PDL may overlap corresponding one of the multiple partition walls BK.

The organic electroluminescence device OEL may include a first electrode EL1 and a second electrode EL2 which face each other, and an organic layer OL disposed between the first electrode EL1 and the second electrode EL2. The organic layer OL may include a hole transport region, an emission layer, and an electron transport region. The hole transport region may include a hole injection layer adjacent to the first electrode EL1 and a hole transport layer disposed between the hole injection layer and the emission layer, and the electron transport region may include an electron injection layer adjacent to the second electrode EL2 and an electron transport layer disposed between the emission layer and the electron injection layer.

The thin film encapsulation layer TFE may be disposed on the organic electroluminescence device OEL, and the thin film encapsulation layer TFE may be disposed on the second electrode EL2. The thin film encapsulation layer TFE may be directly disposed on the second electrode EL2. The thin film encapsulation layer TFE may be formed by stacking a single layer or multiple layers.

Referring to FIG. 8B, the display module DM-1 of an embodiment may not include the base layer BL disposed on a color filter layer CFL-1, unlike the display module DM of FIG. 8A. In addition to a first capping layer CPL1, a second capping layer CPL2 may be further disposed to prevent a light control layer CCL-1 from being exposed to moisture or oxygen. The color filter layer CFL-1 may be disposed on the light control layer CCL-1. The color filter layer CFL-1 may include a low refractive layer LRL-1. The color filter layer CFL-1 may include the light shielding unit BM-1 and color filters CF-B1, CF-G1, and CF-R1. However, the embodiments are not limited thereto, and some of the low refractive layer LRL-1, the light shielding unit BM-1, and the color filters CF-B1, CF-G1, and CF-R1 which are included in the color filter layer CFL-1 may be omitted. The color filter layer CFL-1 may be formed on the light control layer CCL-1 by a continuous process. For example, the light control layer CCL-1 and the color filter layer CFL-1 may be sequentially formed on the display panel DP of the display module DM of an embodiment by the continuous process.

Figure 9:
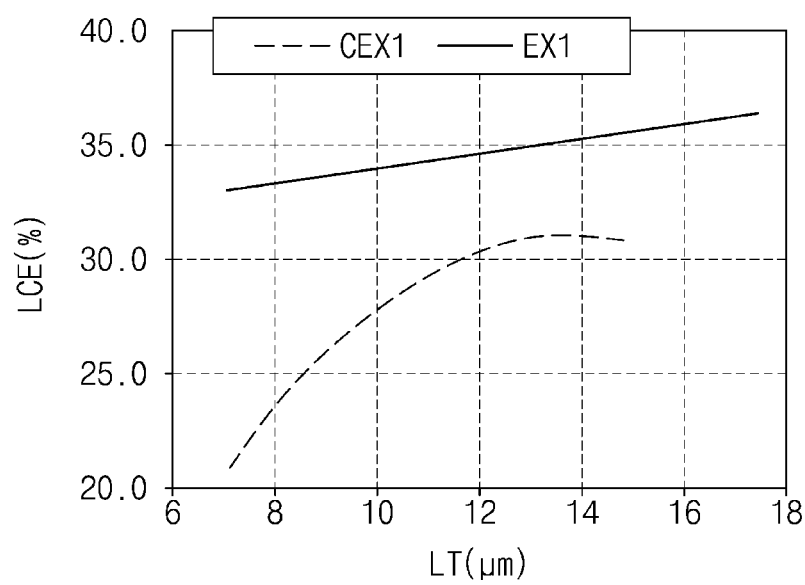
FIG. 9 is a graph illustrating external quantum efficiency according to the thickness of a light control unit according to an embodiment of the disclosure and a light control unit according to a comparative example.

FIG. 9 is a graph showing light conversion efficiency LCE depending on the thickness (LT) of the light control unit EX1 according to Example 1 of the disclosure and the thickness of the light control unit CEX1 according to Comparative Example 1 (CEX1). The light control unit EX1 of Example 1 may be the first light control unit CCP-G (see, e.g., FIG. 3). The light control unit EX1 of Example 1 and the light control unit CEX1 according to Comparative Example 1 may be made of the same ink, but the light control unit EX1 of Example 1 may be made by the manufacturing method of an embodiment to include the first region CCP-G1 (FIG. 3) and the second region CCP-G2 (FIG. 3), and the light control unit CEX1 according to Comparative Example 1 is subjected to a curing process immediately after ink is applied thereto once, thereby including only the second region CCP-G2 (FIG. 3).

The light control unit EX1 of Example 1 may exhibit a desired light conversion efficiency in all the thickness compared to the light control unit CEX1 according to Comparative Example 1. Moreover, even though the thickness of the light control unit EX1 of Example 1 becomes smaller than that of the light control unit CEX1 according to Comparative Example 1, it can be seen that the light control unit EX1 has a light conversion efficiency equal or superior to that of the light control unit CEX1.

Figure 10A:
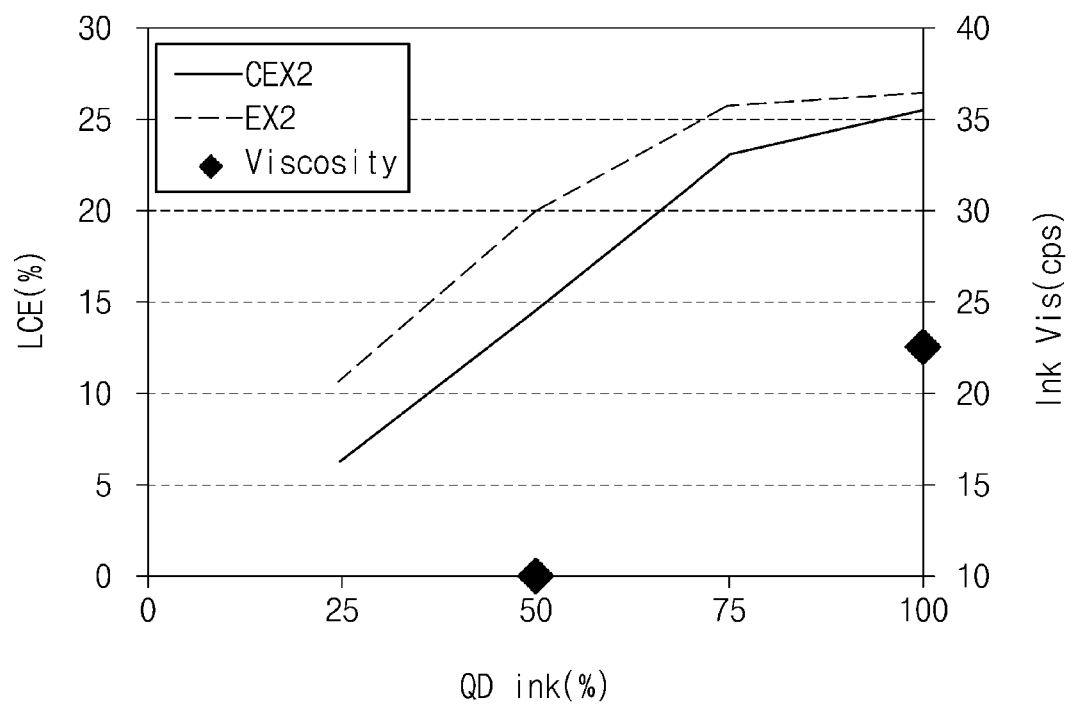
FIGS. 10A and 10B are graphs illustrating external quantum efficiency according to the quantum dot content of the light control unit according to an embodiment of the disclosure and the light control unit according to a comparative example.

FIG. 10A is a graph showing light conversion efficiency LCE depending on the ratio of light emitters in ink (QD ink) of a light control unit EX2 according to Example 2 and a light control unit CEX2 according to Comparative Example 2. The light control unit EX2 according to Example 2 may be the second light control unit CCP-R (FIG. 3). The light control unit EX2 of Example 2 and the light control unit CEX2 according to Comparative Example 2 may be made of the same ink, but the light control unit EX2 of Example 2 may be made by the manufacturing method of an embodiment to include the first region CCP-R1 (FIG. 3) and the second region CCP-R2 (FIG. 3), and the light control unit CEX2 according to Comparative Example 2 may be subjected to a curing process immediately after ink is applied thereto once, thereby including only the second region CCP-R2 (FIG. 3).

Figure 10B:
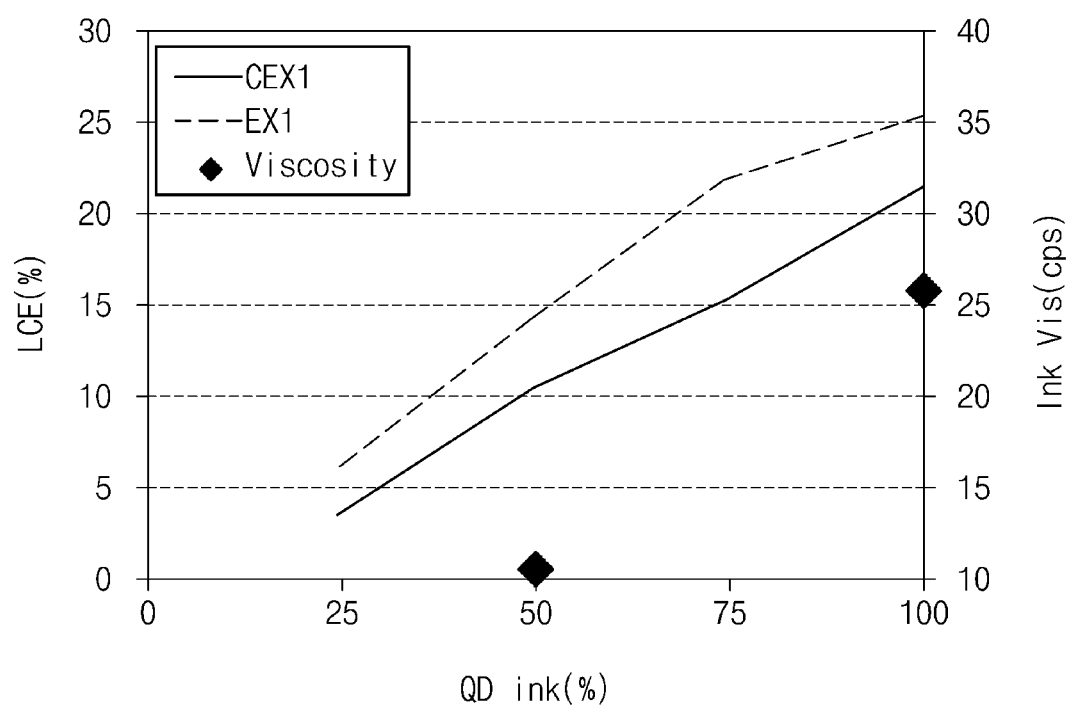

FIG. 10B is a graph showing light conversion efficiency LCE depending on the ratio of the light emitters in ink (QD ink) of the light control unit EX1 according to Example 1 and the light control unit CEX1 according to Comparative Example 1. The light control unit EX1 according to Example 1 and the light control unit CEX1 according to Comparative Example 1 may be the same as those of FIG. 9.

Referring to FIGS. 10A and 10B, even though the light control units are formed by using the same ink, it can be seen that the light control units EX1 and EX2 according to Examples 1 and 2 have a desired light conversion efficiency LCE compared to the light control units CEX1 and CEX2 of Comparative Examples 1 and 2. Therefore, it can be seen that the display apparatus ES including the light control units CCP according to an example may ensure a desired luminous efficiency.

According to an embodiment, the light control unit may include a layer having a high concentration of an inorganic material to improve the luminous efficiency, thereby the display apparatus exhibiting desired display quality.

According to an embodiment, costs may be reduced by decreasing the thickness of the light control unit, and viscosity of ink may be improved by reducing the content of the inorganic material, thereby providing the manufacturing method of the light control member having improved defective processes.

Although the disclosure has been described with reference to an embodiment of the disclosure, it will be understood that the disclosure should not be limited to these embodiments but various changes and modifications can be made by those skilled in the art without departing from the spirit and scope of the disclosure. Accordingly, the technical scope of the disclosure is not intended to be limited to the contents set forth in the detailed description of the specification, and the claimed invention is intended to be defined by the appended claims.

What is claimed is:

1. A display apparatus comprising:
   a display panel; and
   a light control member disposed on the display panel, wherein
   the light control member comprises:
   a plurality of partition walls spaced apart from each other; and
   a plurality of light control units each disposed between any two of the plurality of partition walls, and
   at least one of the plurality of light control units comprises:
   a first region including organic monomers and an inorganic material; and
   a second region disposed the first region and including the inorganic material dispersed in an organic polymer.

2. The display apparatus of claim 1, wherein the inorganic material comprises scattering particles and light emitters.

3. The display apparatus of claim 1, wherein a concentration of the inorganic material in the first region is greater than a concentration of the inorganic material in the second region.

4. The display apparatus of claim 1, wherein a ratio of a concentration of the inorganic material in the second region to a concentration of the inorganic material in the first region is in a range of about 1:1.5 to about 1:20.

5. The display apparatus of claim 1, wherein a ratio of a thickness of the first region in a vertical direction to a thickness of the second region in the vertical direction is in a range of about 1:1 to about 1:200.

6. The display apparatus of claim 5, wherein
   the thickness of the first region is in a range of about 0.1 µm to about 5 µm, and
   the thickness of the second region is in a range of about 5 µm to about 20 µm.

7. The display apparatus of claim 2, wherein with respect to a total volume of the first region,
   a volume of the organic monomers of the first region is in a range of about 0.01% to about 10%, and
   a volume of the light emitters of the first region is in a range of about 10% to about 99.9%.

8. The display apparatus of claim 2, wherein with respect to a total volume of the second region,
a volume of the organic polymer of the second region is in a range of about 10% to about 90%, and
a volume of the light emitters of the second region is in a range of about 5% to about 50%.

9. The display apparatus of claim 1, wherein the organic polymer of the second region is a photocured polymer of the organic monomers.

10. The display apparatus of claim 1, wherein
the display panel comprises a light emitting element generating first light,
the light control member comprises:
a transmission unit transmitting the first light;
a first light control unit converting the first light into second light; and
a second light control unit converting the first light into third light, and
the first light control unit and the second light control unit comprises the first region and the second region.

11. The display apparatus of claim 10, wherein
the inorganic material of the first light control unit comprises a first light emitter converting the first light into the second light, and
the inorganic material of the second light control unit comprises a second light emitter converting the first light into the third light.

12. The display apparatus of claim 10, wherein the transmission unit comprises scatterers dispersed in the organic polymer.

13. A display apparatus comprising:
a display panel generating first light; and
a light control layer disposed on the display panel, wherein
the light control layer comprises:
a transmission unit transmitting the first light;
a first light control unit converting the first light into second light; and
a second light control unit converting the first light into third light, and
at least one of the first light control unit and the second light control unit comprises:
a first region including organic monomers and an inorganic material; and
a second region disposer on the first region and including the inorganic material dispersed in an organic polymer.

14. The display apparatus of claim 13, wherein the display panel comprises:
a light emitting element generating the first light;
an encapsulation member disposed on the light emitting element; and
a capping layer disposed on the encapsulation member and the light control layer.

15. The display apparatus of claim 13, further comprising a color filter layer disposed on the light control unit, the color filter layer comprising:
a first color filter unit overlapping the transmission unit and transmitting the first light;
a second color filter unit overlapping the first light control unit, blocking the first light, and transmitting the second light; and
a third color filter unit overlapping the second light control unit, blocking the first light, and transmitting the third light.

16. A manufacturing method of a light control member, comprising:
forming a color filter layer; and
forming a light control layer including a plurality of light control units on the color filter layer, wherein
the forming of the light control layer comprises:
providing a first ink on the color filter layer to form a first ink layer;
providing heat to the first ink layer to form a first region;
providing the first ink on the first region to form a second ink layer; and
curing the second ink layer to form a second region, and
the first ink comprises organic monomers, light emitters, and a photoinitiator.

17. The manufacturing method of claim 16, wherein the providing of the heat to the first ink layer to form the first region comprises providing the heat in a range of about 150° C. to about 200° C. onto the first ink layer to form the first region having a smaller thickness than a thickness of the first ink layer.

18. The manufacturing method of claim 16, wherein the forming of the color filter layer comprises forming a first color filter, a second color filter, and a third color filter to be disposed adjacent to each other on a plane.

19. The manufacturing method of claim 18, further comprising, before the providing of the first ink on the color filter layer to form the first ink layer, disposing a plurality of partition walls so that openings are generated in regions overlapping the first color filter, the second color filter, and the third color filter,
wherein the first ink is provided to at least one of openings overlapping the second color filter and the third color filter.

20. The manufacturing method of claim 16, wherein the providing of the first ink to form the first ink layer and the providing of heat to the first ink layer to form the first region are repeatedly performed at least two times.

* * * * *